United States Patent
Yamamori

[19]

[11] Patent Number: 6,087,205
[45] Date of Patent: Jul. 11, 2000

[54] METHOD OF FABRICATING STAGGERED THIN FILM TRANSISTOR WITH AN IMPROVED OHMIC CONTACT STRUCTURE

[75] Inventor: Shuki Yamamori, Tokyo, Japan

[73] Assignee: NEC Corporation, Tokyo, Japan

[21] Appl. No.: 08/985,875

[22] Filed: Dec. 5, 1997

Related U.S. Application Data

[62] Division of application No. 08/842,770, Apr. 17, 1997, Pat. No. 5,864,149.

[30] Foreign Application Priority Data

Apr. 18, 1996 [JP] Japan ................................ 8-096358

[51] Int. Cl.⁷ .................................................. H01L 21/00
[52] U.S. Cl. .................................. 438/158; 148/DIG. 53; 438/161
[58] Field of Search ................................. 438/158, 159, 438/161; 148/DIG. 53, FOR 183, FOR 184

[56] References Cited

U.S. PATENT DOCUMENTS

| | | |
|---|---|---|
| 4,601,097 | 7/1986 | Shimbo . |
| 4,733,284 | 3/1988 | Aoki . |
| 4,864,376 | 9/1989 | Aoki . |
| 5,728,592 | 3/1998 | Oki et al. . |
| 5,824,572 | 10/1998 | Fukui et al. . |
| 5,869,351 | 2/1999 | Kawahata et al. . |
| 5,879,973 | 3/1999 | Yanai et al. . |

OTHER PUBLICATIONS

Wolf et al., Silicon Processing for the VLSI Era, V1—Process Technology, pp. 161–195, 363–369, 1986.

Primary Examiner—Charles Bowers
Assistant Examiner—Scott J. Hawranek
Attorney, Agent, or Firm—Young & Thompson

[57] ABSTRACT

A method of forming multi-layer structure of source/drain electrodes and an amorphous silicon layer in a forward staggered thin film transistor. Source/drain electrodes are selectively provided on an insulator. Each of the source/drain electrodes comprises an undoped transparent conductive film on the insulator and an impurity doped transparent conductive film on the insulator and an impurity doped transparent conductive film extending over the undoped transparent conductive film. An amorphous silicon active layer extends over the source/drain electrodes and a top surface of the insulator so that the amorphous silicon active layer over the source/drain electrodes has an impurity diffused interface in contact with the impurity doped transparent conductive film to form ohmic contacts between the impurity doped transparent conductive film and the amorphous silicon active layer. The amorphous silicon active layer in contact wit the top surface of the insulator between the source/drain electrodes is free of impurities.

30 Claims, 3 Drawing Sheets

METHOD OF FABRICATING STAGGERED THIN FILM TRANSISTOR WITH AN IMPROVED OHMIC CONTACT STRUCTURE

CROSS-REFERENCE TO RELATED APPLICATIONS

This application is a division of application Ser. No. 08/842,770, filed Apr. 17, 1997 now U.S. Pat. No. 5,864,149.

BACKGROUND OF THE INVENTION

The present invention relates to a thin film transistor and a method of fabricating the same, and more particularly to a staggered thin film transistor with an improved ohmic contact structure between source/drain electrodes and an amorphous silicon layer and a method of forming an improved ohmic contact structure between source/drain electrodes and an amorphous silicon layer.

In recent years, requirement for reduction in the cost of manufacturing a thin film transistor color liquid crystal display has been on the increase. Reduction in the cost of fabricating thin film transistor arrays is the essential issue in order to realize the required reduction in the manufacturing cost of the thin film transistor color liquid crystal display. An inverse staggered thin film transistor with a bottom gate structure has widely been used. Notwithstanding, a forward staggered thin film transistor with a top gate structure would be advantageous in lower manufacturing cost. Particularly, a forward staggered thin film transistor with source/drain electrodes comprising transparent and conductive films would be attractive in reduced manufacturing cost because this transistor may be fabricated by reduced number of manufacturing processes.

A first conventional method of fabricating a first conventional forward staggered thin film transistor will be described with reference to FIGS. 1A through 1C wherein this first conventional forward staggered thin film transistor has an ohmic contact between source/drain electrodes and an amorphous silicon layer. This is disclosed in the Japanese laid-open patent publication No. 61-198678.

With reference to FIG. 1A, a glass substrate 1 is prepared. An indium tin oxide film 4 is deposited by a sputtering method on a top surface of the glass substrate 1. An n$^+$-doped amorphous silicon 10 is then deposited by a chemical vapor deposition method on a top surface of the indium tin oxide film 4.

With reference to FIG. 1B, laminations of the indium tin oxide film 4 and the n$^+$-doped amorphous silicon 10 are patterned by a photo-lithography method and dry etched to define source/drain electrodes 6 on the top surface of the glass substrate 1.

With reference to FIG. 1C, an amorphous silicon film 7 is deposited by a plasma chemical vapor deposition method over the source/drain electrodes 6 and the top surface of the glass substrate 1. A gate insulation film 8 made of silicon nitride is then deposited by a plasma chemical vapor deposition method on a top surface of the amorphous silicon film 7. A metal film 9 such as a chromium film is deposited by a sputtering method on a top surface of the gate insulation film 8. Laminations of the amorphous silicon film 7, the gate insulation film 8 and the metal film 9 are patterned by a photo-lithography method and a dry etching to define a gate electrode 9, the gate insulation film 8 and the amorphous silicon film 7. The n$^+$-doped amorphous silicon 10 is so heavily doped as to provide ohmic contacts between the indium tin oxide films 4 and the amorphous silicon film 7. As a result, the forward staggered amorphous silicon thin film transistor is completed.

A second conventional method of fabricating a second conventional forward staggered thin film transistor will be described with reference to FIGS. 2A through 2C wherein this second conventional forward staggered thin film transistor has an ohmic contact between source/drain electrodes and an amorphous silicon layer. The ohmic contact is formed by a treatment in an impurity containing plasma atmosphere. This is disclosed in the Japanese laid-open patent publication No. 62-81064.

With reference to FIG. 2A, a glass substrate 1 is prepared. An indium tin oxide film 4 is deposited by a sputtering method on a top surface of the glass substrate 1.

With reference to FIG. 2B, the indium tin oxide film 4 is patterned by a photo-lithography method and a dry etching to define source/drain electrodes 6 on the top surface of the glass substrate 1. Subsequently, surfaces of the glass substrate 1 and the source/drain electrodes 6 are subjected to a PH$_3$ plasma 11 to introduce phosphorus into surface regions of the glass substrate 1 and the source/drain electrodes 6 whereby not only phospho-containing indium tin oxide films 4a are formed in the top and side surface regions of the source/drain electrodes 6 but also phospho-containing glass films 1a are formed in the top surface region of the glass substrate 1.

With reference to FIG. 2C, an amorphous silicon film 7 is deposited by a plasma chemical vapor deposition method over the phospho-containing indium tin oxide films 4a and the phospho-containing glass films 1a. A gate insulation film 8 made of silicon nitride is then deposited by a plasma chemical vapor deposition method on a top surface of the amorphous silicon film 7. A metal film 9 such as a chromium film is deposited by a sputtering method on a top surface of the gate insulation film 8. Laminations of the amorphous silicon film 7, the gate insulation film 8 and the metal film 9 are patterned by a photo-lithography method and a dry etching to define a gate electrode 9, the gate insulation film 8 and the amorphous silicon film 7. The phospho-containing indium tin oxide films 4a is so heavily doped as to provide ohmic contacts between the indium tin oxide films 4 and the amorphous silicon film 7. Also the phospho-containing glass films 1a is heavily doped. As a result, the forward staggered amorphous silicon thin film transistor is completed.

A third conventional method of fabricating a third conventional forward staggered thin film transistor will be described, wherein this third conventional forward staggered thin film transistor has an ohmic contact between source/drain electrodes and an amorphous silicon layer. The third conventional forward staggered thin film transistor also has a indium thin oxide film entirely doped with phosphorus. The phospho-containing indium thin oxide film may be deposited by sputtering a phospho-containing indium thin oxide target. Alternatively, the phospho-containing indium thin oxide film may be formed by a deposition of an indium thin oxide film and subsequent exposure of the indium thin oxide film to a PH$_3$ plasma. Further alternatively, the phospho-containing indium thin oxide film may be formed by a deposition of an indium thin oxide film and subsequent thermal diffusion of phosphorus into the indium thin oxide film. This is disclosed in the Japanese laid-open patent publication No. 62-81057.

The above first conventional method of the of fabricating the first conventional forward staggered thin film transistor has the following problems. As described above, the $n^+$-doped amorphous silicon film 10 is formed on the indium tin oxide film 4 and then the amorphous silicon film 7 is formed on the $n^+$-doped amorphous silicon film 10. The $n^+$-doped amorphous silicon film, however, has a deteriorated adhesiveness to other films, for which reason the $n^+$-doped amorphous silicon film 10 is likely to be peeled from the indium tin oxide film 4 or the amorphous silicon film 7 is likely to be peeled from the $n^+$-doped amorphous silicon film 10.

Further, the $n^+$-doped amorphous silicon film 10 is formed in the other deposition system than the deposition system used for forming the indium tin oxide film 4. This increases the number of the fabrication processes, resulting in the manufacturing cost being risen.

The above second conventional method of the of fabricating the second conventional forward staggered thin film transistor also has the following problems. As described above, not only the phospho-containing indium tin oxide films 4a are formed in the top and side surface regions of the source/drain electrodes 6 but also the phospho-containing glass films 1a are formed in the top surface region of the glass substrate 1. For those reason, when the amorphous silicon film 7 is then formed on the phospho-containing indium tin oxide films 4a and the phospho-containing glass films 1a, phosphorus may be diffused from the phospho-containing glass films 1a into the amorphous silicon film 7 whereby a phospho-diffused amorphous silicon region is formed in the amorphous silicon film 7. The indium tin oxide films 4 serving as the source/drain electrodes are connected to each other via the phospho-diffused amorphous silicon region. This may cause a current leakage between the indium tin oxide film source/drain electrodes 4 through the phospho-diffused amorphous silicon region of the amorphous silicon film 7. The current leakage deteriorates the performance of the forward staggered thin film transistor.

Further, the amorphous silicon film 7 is formed in the other deposition system than the deposition system used for forming the indium tin oxide film 4. This increases the number of the fabrication processes, resulting in the manufacturing cost being risen.

The above third conventional method of the of fabricating the third conventional forward staggered thin film transistor also has the following problems. As described above, an impurity is doped into the entire parts of the indium tin oxide film at a relatively high impurity concentration. For those reasons, the impurity doped indium tin oxide film has a high resistivity.

Further, if the phospho-containing indium thin oxide film is deposited by sputtering a phospho-containing indium thin oxide target which is expensive, then the manufacturing cost is increased.

If, alternatively, the phospho-containing indium thin oxide film is formed by a deposition of an indium thin oxide film and subsequent exposure of the indium thin oxide film to a $PH_3$ plasma to introduce phosphorus into the entire parts of the indium thin oxide film, the $PH_3$ plasma treatment is carried out in other system than the deposition system for depositing the indium thin oxide film. This increases the number of the fabrication processes, resulting in the manufacturing cost being risen.

If, further alternatively, the phospho-containing indium thin oxide film is formed by a deposition of an indium thin oxide film and subsequent thermal diffusion of phosphorus into the indium thin oxide film, the thermal diffusion of phosphorus is carried out in other system than the deposition system for depositing the indium thin oxide film. This increases the number of the fabrication processes, increasing the manufacturing cost. Further, the glass substrate is weak to the thermal treatment at a high temperature because of its softening point in the order of 500° C., for which reason the glass substrate is unavailable practically.

In the above circumstances, it had been required to develop a novel forward staggered thin film transistor having source/drain electrodes with a reduced resistivity and has high performances but free of current leakage as well as develop a novel method of fabricating such forward staggered thin film transistor at a low manufacturing cost.

SUMMARY OF THE INVENTION

Accordingly, it is an object of the present invention to provide a novel forward staggered thin film transistor having ohmic contacts between indium tin oxide film source/drain electrodes and an amorphous silicon film, wherein the novel forward staggered thin film transistor is free from any problems or disadvantages as described above.

It is a further object of the present invention to provide a novel forward staggered thin film transistor having ohmic contacts between indium tin oxide film source/drain electrodes and an amorphous silicon film, wherein the indium tin oxide film source/drain electrodes have a reduced resistivity.

It is a still further object of the present invention to provide a novel forward staggered thin film transistor having ohmic contacts between indium tin oxide film source/drain electrodes and an amorphous silicon film, wherein the novel forward staggered thin film transistor possesses high performances.

It is yet a further object of the present invention to provide a novel forward staggered thin film transistor having ohmic contacts between indium tin oxide film source/drain electrodes and an amorphous silicon film, wherein the novel forward staggered thin film transistor is free of any substantial current leakage between the indium tin oxide film source/drain electrodes.

It is further more object of the present invention to provide a novel method of fabricating a forward staggered thin film transistor, having ohmic contacts between indium tin oxide film source/drain electrodes and an amorphous silicon film, wherein the novel method may realize a substantial reduction in manufacturing cost thereof.

It is still more object of the present invention to provide a novel method of fabricating a forward staggered thin film transistor, having ohmic contacts between indium tin oxide film source/drain electrodes and an amorphous silicon film, wherein the novel method needs no increase in the number of fabricating processes thereof.

It is yet more object of the present invention to provide a novel method of fabricating a forward staggered thin film transistor, having ohmic contacts between indium tin oxide film source/drain electrodes and an amorphous silicon film, wherein the novel method uses no expensive target for forming the indium tin oxide film.

It is moreover object of the present invention to provide a novel method of fabricating a forward staggered thin film transistor, having ohmic contacts between indium tin oxide film source/drain electrodes and an amorphous silicon film, wherein the indium tin oxide film source/drain electrodes have a reduced resistivity.

It is another object of the present invention to provide a novel method of fabricating a forward staggered thin film transistor, having ohmic contacts between indium tin oxide film source/drain electrodes and an amorphous silicon film, wherein the novel forward staggered thin film transistor possesses high performances.

It is further another object of the present invention to provide a novel method of fabricating a forward staggered thin film transistor, is having ohmic contacts between indium tin oxide film source/drain electrodes and an amorphous silicon film, wherein the novel forward staggered thin film transistor free of any substantial current leakage between the indium tin oxide film source/drain electrodes.

The above and other objects, features and advantages of the present invention will be apparent from the following descriptions.

The present invention provides a multi-layer structure between source/drain electrodes and an amorphous silicon layer in a forward staggered thin film transistor. The multi-layer structure comprises the following elements. Source/drain electrodes are selectively provided on an insulator. Each of the source/drain electrodes comprises an undoped transparent conductive film extending on the insulator and an impurity doped transparent conductive film extending over the undoped transparent conductive film. An amorphous silicon active layer extends over the source/drain electrodes and a top surface of the insulator so that the amorphous silicon active layer over the source/drain electrodes has an impurity diffused interface in contact with the impurity doped transparent conductive film to form ohmic contacts between the impurity doped transparent conductive film and the amorphous silicon active layer, whilst the amorphous silicon active layer being in contact with the top surface of the insulator and being positioned between the source/drain electrodes is free of any impurity introduced region.

The present invention provides a forward staggered thin film transistor comprising the following elements. Source/drain electrodes are selectively provided on an insulator. Each of the source/drain electrodes comprises an undoped transparent conductive film extending on the insulator and an impurity doped transparent conductive film extending over the undoped transparent conductive film. An amorphous silicon active layer extends over the source/drain electrodes and a top surface of the insulator so that the amorphous silicon active layer over the source/drain electrodes has an impurity diffused interface in contact with the impurity doped transparent conductive film to form an ohmic contact between the impurity doped transparent conductive film and the amorphous silicon active layer, whilst the amorphous silicon active layer being in contact with the top surface of the insulator and being positioned between the source/drain electrodes is free of any impurity introduced region. A gate insulation film extends over the amorphous silicon active layer. A gate electrode is provided on the gate insulation film.

The present invention provides a method of forming a multi-layer structure between source/drain electrodes and an amorphous silicon layer in a forward staggered thin film transistor. The method comprises the following steps. An undoped transparent conductive film is formed on an insulator. An impurity doped transparent conductive film is formed on the undoped transparent conductive film. Laminations of the undoped transparent conductive film and the impurity doped transparent conductive film are patterned to form source/drain electrodes. An amorphous silicon active layer is formed over the source/drain electrodes and a top surface of the insulator along with a heat treatment so that in the amorphous silicon active layer over the source/drain electrodes, an impurity diffused interface is formed, which is in contact with the impurity doped transparent conductive film thereby to form ohmic contacts between the impurity doped transparent conductive film and the amorphous silicon active layer, whilst no impurity introduced region is formed in the amorphous silicon active layer being in contact with the top surface of the insulator and being positioned between the source/drain electrodes.

The present invention provides a method of forming a forward staggered thin film transistor. The method comprises the following steps. An undoped transparent conductive film is formed on an insulator. An impurity doped transparent conductive film is formed on the undoped transparent conductive film. Laminations of the undoped transparent conductive film and the impurity doped transparent conductive film are patterned to form source/drain electrodes. An amorphous silicon active layer and a gate insulation film are successively formed over the source/drain electrodes and a top surface of the insulator along with a heat treatment so that in the amorphous silicon active layer over the source/drain electrodes, an impurity diffused interface is formed which is in contact with the impurity doped transparent conductive film thereby to form ohmic contacts between the impurity doped transparent conductive film and the amorphous silicon active layer, whilst no impurity introduced region is formed in the amorphous silicon active layer being in contact with the top surface of the insulator and being positioned between the source/drain electrodes. A gate electrode film is formed on the gate insulation film. Laminations of the amorphous silicon active layer, the gate insulation film and the gate electrode film are patterned.

The present invention provides a method of forming a forward staggered thin film transistor. The method comprises the following steps. An optical shielding metal film is selectively formed on a first predetermined region of a top surface of a glass substrate. An inter-layer insulator is formed which extends over the optical shielding metal film and the top surface of the glass substrate. An undoped indium tin oxide film is formed on the inter-layer insulator. An impurity doped indium tin oxide film is formed on the undoped indium tin oxide film. Laminations of the undoped indium tin oxide film and the impurity doped indium tin oxide film to form source/drain electrodes are patterned. An amorphous silicon active layer and a gate insulation film are successively formed over the source/drain electrodes and a top surface of the insulator along with a plasma chemical vapor deposition method so that in the amorphous silicon active layer over the source/drain electrodes, an impurity diffused interface is formed which is in contact with the impurity doped indium tin oxide film thereby to form ohmic contacts between the impurity doped indium tin oxide film and the amorphous silicon active layer, whilst no impurity introduced region is formed in the amorphous silicon active layer being in contact with the top surface of the insulator and being positioned between the source/drain electrodes. A gate electrode film is formed on the gate insulation film. Laminations of the amorphous silicon active layer, the gate insulation film and the gate electrode film are formed.

BRIEF DESCRIPTIONS OF THE DRAWINGS

Preferred embodiments of the present invention will be described in detail with reference to the accompanying drawings.

DISCLOSURE OF THE INVENTION

Figure 1A:
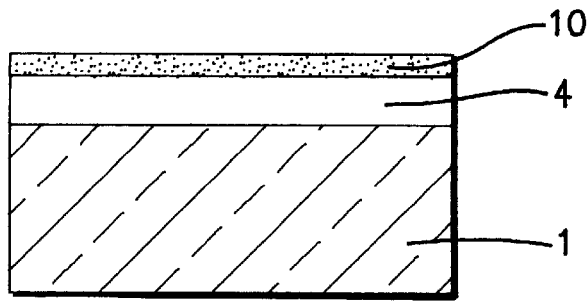
FIGS. 1A through 1C are fragmentary cross sectional elevation views illustrative of the first conventional forward staggered thin film transistor in the processes involved in the first conventional method of fabricating the same.
Figure 1B:
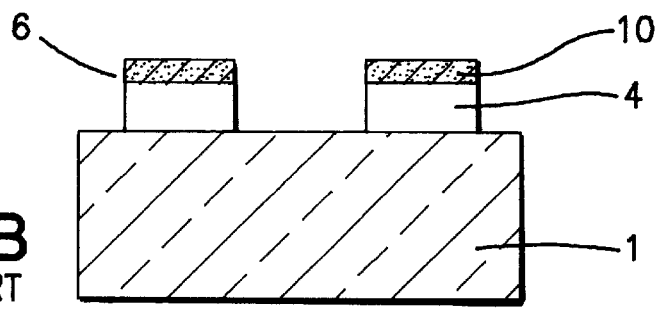
Figure 1C:
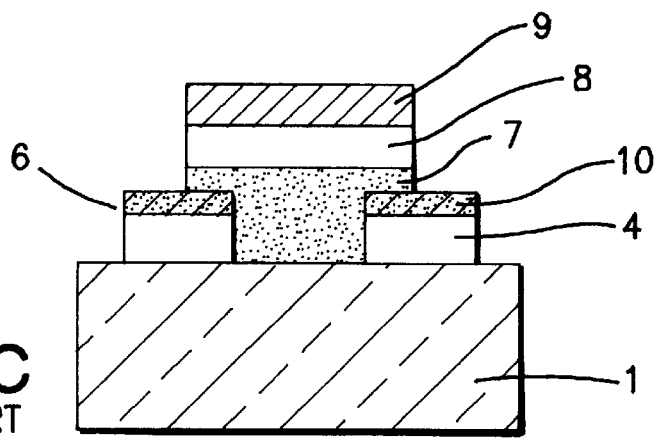

The present invention provides a multi-layer structure between source/drain electrodes and an amorphous silicon layer in a forward staggered thin film transistor. The multi-layer structure comprises the following elements. Source/drain electrodes are selectively provided on an insulator. Each of the source/drain electrodes comprises an undoped transparent conductive film extending on the insulator and an impurity doped transparent conductive film extending over the undoped transparent conductive film. An amorphous silicon active layer extends over the source/drain electrodes and a top surface of the insulator so that the amorphous silicon active layer over the source/drain electrodes has an impurity diffused interface in contact with the impurity doped transparent conductive film to form ohmic contacts between the impurity doped transparent conductive film and the amorphous silicon active layer, whilst the amorphous silicon active layer being in contact with the top surface of the insulator and being positioned between the source/drain electrodes is free of any impurity introduced region.

It is preferable that the undoped transparent conductive film comprises an indium tin oxide film.

It is also preferable that the undoped transparent conductive film comprises an indium oxide film.

It is also preferable that the undoped transparent conductive film comprises a tin oxide film.

It is also preferable that the impurity doped transparent conductive film comprises an impurity doped indium tin oxide film.

It is also preferable that the impurity doped transparent conductive film comprises an impurity doped indium oxide film.

It is also preferable that the impurity doped transparent conductive film comprises an impurity doped tin oxide film.

It is also preferable that the impurity doped transparent conductive film has a thickness of approximately 10% or less of a total thickness of the undoped transparent conductive film and the impurity doped transparent conductive film.

It is also preferable that the insulator comprises an inter-layer insulator made of silicon oxide.

It is also preferable that the insulator comprises an insulation substrate.

The present invention provides a forward staggered thin film transistor comprising the following elements. Source/drain electrodes are selectively provided on an insulator. Each of the source/drain electrodes comprises an undoped transparent conductive film extending on the insulator and an impurity doped transparent conductive film extending over the undoped transparent conductive film. An amorphous silicon active layer extends over the source/drain electrodes and a top surface of the insulator so that the amorphous silicon active layer over the source/drain electrodes has an impurity diffused interface in contact with the impurity doped transparent conductive film to form an ohmic contact between the impurity doped transparent conductive film and the amorphous silicon active layer, whilst the amorphous silicon active layer being in contact with the top surface of the insulator and being positioned between the source/drain electrodes is free of any impurity introduced region. A gate insulation film extends over the amorphous silicon active layer. A gate electrode is provided on the gate insulation film.

It is preferable that the undoped transparent conductive film comprises an indium tin oxide film.

It is also preferable that the undoped transparent conductive film comprises an indium oxide film.

It is also preferable that the undoped transparent conductive film comprises a tin oxide film.

It is also preferable that the impurity doped transparent conductive film comprises an impurity doped indium tin oxide film.

It is also preferable that the impurity doped transparent conductive film comprises an impurity doped indium oxide film.

It is also preferable that the impurity doped transparent conductive film comprises an impurity doped tin oxide film.

It is also preferable that the impurity doped transparent conductive film has a thickness of approximately 10% or less of a total thickness of the undoped transparent conductive film and the impurity doped transparent conductive film.

It is also preferable that the insulator comprises an inter-layer insulator made of silicon oxide.

It is also preferable that the insulator comprises an insulation substrate.

The present invention provides a forward staggered thin film transistor comprising the following elements. An optical shielding metal film is selectively provided on a fist predetermined region of a top surface of a glass substrate. An inter-layer insulator extends over the optical shielding metal film and the top surface of the glass substrate. Source/drain electrodes are selectively provided on second predetermined regions of a top surface of the inter-layer insulator. Each of the source/drain electrodes comprises an undoped indium tin oxide film extending on the inter-layer insulator and an impurity doped indium tin oxide film extending over the undoped indium tin oxide film. An amorphous silicon active layer extends over the source/drain electrodes and the top surface of the inter-layer insulator so that the amorphous silicon active layer over the source/drain electrodes has an impurity diffused interface in contact with the impurity doped indium tin oxide film to form an ohmic contact between the impurity doped indium tin oxide film and the amorphous silicon active layer, whilst the amorphous silicon active layer being in contact with the top surface of the inter-layer insulator and being positioned between the source/drain electrodes is free of any impurity introduced region. A gate insulation film extends over the amorphous silicon active layer. A gate electrode is provided on the gate insulation film.

It is preferable that the impurity doped indium tin oxide film has a thickness of approximately 10% or less of a total thickness of the undoped indium tin oxide film and the impurity doped indium tin oxide film.

The present invention provides a method of forming a multi-layer structure between source/drain electrodes and an amorphous silicon layer in a forward staggered thin film transistor. The method comprises the following steps. An undoped transparent conductive film is formed on an insulator. An impurity doped transparent conductive film is formed on the undoped transparent conductive film. Laminations of the undoped transparent conductive film and the impurity doped transparent conductive film are patterned to form source/drain electrodes. An amorphous silicon active layer is formed over the source/drain electrodes and a top surface of the insulator along with a heat treatment so that in the amorphous silicon active layer over the source/drain electrodes, an impurity diffused interface is formed, which is in contact with the impurity doped transparent conductive film thereby to form ohmic contacts between the impurity doped transparent conductive film and the amorphous silicon active layer, whilst no impurity introduced region is formed in the amorphous silicon active layer being in contact with the top surface of the insulator and being positioned between the source/drain electrodes.

It is preferable that the heat treatment is carried out at a temperature in the range of 200° C. to 350° C.

It is also preferable that the amorphous silicon active layer is deposited by a plasma chemical vapor deposition method.

It is also preferable that the undoped transparent conductive film and the impurity doped transparent conductive film are successively deposited in an in-line sputtering apparatus provided with both an impurity doped transparent conductive material target and an undoped transparent conductive material target.

It is also preferable that the impurity doped transparent conductive material target comprises an impurity doped indium tin oxide target and the undoped transparent conductive material target comprises an undoped indium tin oxide target.

It is also preferable that the impurity doped transparent conductive material target comprises an impurity doped indium oxide target and the undoped transparent conductive material target comprises an undoped indium oxide target.

It is also preferable that the impurity doped transparent conductive material target comprises an impurity doped tin oxide target and the undoped transparent conductive material target comprises an undoped tin oxide target.

It is also preferable that the undoped transparent conductive film and the impurity doped transparent conductive film are successively deposited in a single deposition process by use of a single wafer sputtering apparatus having two different chambers being respectively provided with an impurity doped transparent conductive material target and an undoped transparent conductive material target.

It is also preferable that the impurity doped transparent conductive material target comprises an impurity doped indium tin oxide target and the undoped transparent conductive material target comprises an undoped indium tin oxide target.

It is also preferable that the impurity doped transparent conductive material target comprises an impurity doped indium oxide target and the undoped transparent conductive material target comprises an undoped indium oxide target.

It is also preferable that the impurity doped transparent conductive material target comprises an impurity doped tin oxide target and the undoped transparent conductive material target comprises an undoped tin oxide target.

It is also preferable that the impurity doped transparent conductive film is deposited by sputtering an impurity doped transparent conductive material target so that the impurity doped transparent conductive film has a thickness of approximately 10% or less of a total thickness of the undoped transparent conductive film and the impurity doped transparent conductive film.

The present invention provides a method of forming a forward staggered thin film transistor. The method comprises the following steps. An undoped transparent conductive film is formed on an insulator. An impurity doped transparent conductive film is formed on the undoped transparent conductive film. Laminations of the undoped transparent conductive film and the impurity doped transparent conductive film are patterned to form source/drain electrodes. An amorphous silicon active layer and a gate insulation film are successively formed over the source/drain electrodes and a top surface of the insulator along with a heat treatment so that in the amorphous silicon active layer over the source/drain electrodes, an impurity diffused interface is formed which is in contact with the impurity doped transparent conductive film thereby to form ohmic contacts between the impurity doped transparent conductive film and the amorphous silicon active layer, whilst no impurity introduced region is formed in the amorphous silicon active layer being in contact with the top surface of the insulator and being positioned between the source/drain electrodes. A gate electrode film is formed on the gate insulation film. Laminations of the amorphous silicon active layer, the gate insulation film and the gate electrode film are patterned.

It is also preferable that the heat treatment is carried out at a temperature in the range of 200° C. to 350° C.

It is also preferable that the amorphous silicon active layer is deposited by a plasma chemical vapor deposition method.

It is also preferable that the undoped transparent conductive film and the impurity doped transparent conductive film are successively deposited in an in-line sputtering apparatus provided with both an impurity doped transparent conductive material target and an undoped transparent conductive material target.

It is also preferable that the impurity doped transparent conductive material target comprises an impurity doped indium tin oxide target and the undoped transparent conductive material target comprises an undoped indium tin oxide target.

It is also preferable that the impurity doped transparent conductive material target comprises an impurity doped indium oxide target and the undoped transparent conductive material target comprises an undoped indium oxide target.

It is also preferable that the impurity doped transparent conductive material target comprises an impurity doped tin oxide target and the undoped transparent conductive material target comprises an undoped tin oxide target.

It is also preferable that the undoped transparent conductive film and the impurity doped transparent conductive film are successively deposited in a single deposition process by use of a single wafer sputtering apparatus having two different chambers being respectively provided with an impurity doped transparent conductive material target and an undoped transparent conductive material target.

It is also preferable that the impurity doped transparent conductive material target comprises an impurity doped indium tin oxide target and the undoped transparent conductive material target comprises an undoped indium tin oxide target.

It is also preferable that the impurity doped transparent conductive material target comprises an impurity doped indium oxide target and the undoped transparent conductive material target comprises an undoped indium oxide target.

It is also preferable that the impurity doped transparent conductive material target comprises an impurity doped tin oxide target and the undoped transparent conductive material target comprises an undoped tin oxide target.

It is also preferable that the impurity doped transparent conductive film is deposited by sputtering an impurity doped transparent conductive material target so that the impurity doped transparent conductive film has a thickness of approximately 10% or less of a total thickness of the undoped transparent conductive film and the impurity doped transparent conductive film.

The present invention provides a method of forming a forward staggered thin film transistor. The method comprises the following steps. An optical shielding metal film is selectively formed on a first predetermined region of a top surface of a glass substrate. An inter-layer insulator is formed which extends over the optical shielding metal film and the top surface of the glass substrate. An undoped indium tin oxide film is formed on the inter-layer insulator. An impurity doped indium tin oxide film is formed on the undoped indium tin oxide film. Laminations of the undoped indium tin oxide film and the impurity doped indium tin oxide film to form source/drain electrodes are patterned. An amorphous silicon active layer and a gate insulation film are successively formed over the source/drain electrodes and a top surface of the insulator along with a plasma chemical vapor deposition method so that in the amorphous silicon active layer over the source/drain electrodes, an impurity diffused interface is formed which is in contact with the impurity doped indium tin oxide film thereby to form ohmic contacts between the impurity doped indium tin oxide film and the amorphous silicon active layer, whilst no impurity introduced region is formed in the amorphous silicon active layer being in contact with the top surface of the insulator and being positioned between the source/drain electrodes. A gate electrode film is formed on the gate insulation film. Laminations of the amorphous silicon active layer, the gate insulation film and the gate electrode film are formed.

It is preferable that the heat treatment is carried out at a temperature in the range of 200° C. to 350° C.

It is also preferable that the amorphous silicon active layer is deposited by a plasma chemical vapor deposition method.

It is also preferable that the undoped indium tin oxide film and the impurity doped indium tin oxide film are successively deposited in an in-line sputtering apparatus provided with both an impurity doped indium tin oxide target and an undoped indium tin oxide target.

It is also preferable that the undoped transparent conductive film and the impurity doped indium tin oxide film are successively deposited in a single deposition process by use of a single wafer sputtering apparatus having two different chambers being respectively provided with an impurity doped indium tin oxide target and an undoped indium tin oxide target.

It is also preferable that the impurity doped indium tin oxide film is deposited by sputtering an impurity doped indium tin oxide target so that the impurity doped indium tin oxide film has a thickness of approximately 10% or less of a total thickness of the undoped indium tin oxide film and the impurity doped indium tin oxide film.

PREFERRED EMBODIMENT

A preferred embodiment according to the present invention will be described with reference to FIGS. 3 and 4A through 4E, wherein provision is made of a novel forward staggered thin film transistor having ohmic contacts between indium tin oxide film source/drain electrodes and an amorphous silicon film, wherein the novel forward staggered thin film transistor is free from any problems or disadvantages as described above. Also provision is made of a novel method of fabricating a forward staggered thin film transistor, having ohmic contacts between indium tin oxide film source/drain electrodes and an amorphous silicon film, wherein the novel method may realize a substantial reduction in manufacturing cost thereof.

Figure 3:
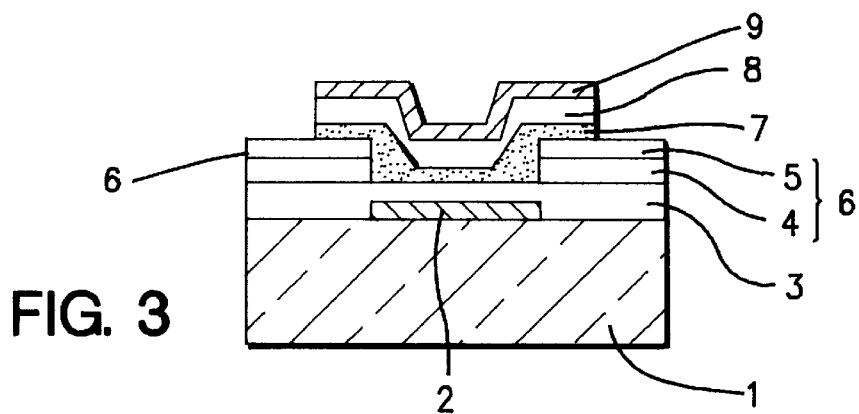
FIG. 3 is a fragmentary cross sectional elevation view illustrative of a novel forward staggered thin film transistor in a preferred embodiment according to the present invention.

As illustrated in FIG. 3, a glass substrate 1 is prepared. A chromium optical shielding film 2 is selectively formed on a predetermined region of a top surface of the glass substrate 1. An inter-layer insulator 3 is provided, which extends over the chromium optical shielding film 2 and the top surface of the glass substrate 1. Undoped indium tin oxide films 4 are selectively provided which extend over predetermined regions of the top surface of the inter-layer insulator 3. Phosphorus-doped indium tin oxide films 5 are provided on the top surfaces of the undoped indium tin oxide films 4. Laminations of the undoped indium tin oxide films 4 and the phosphorus-doped indium tin oxide films 5 form source/drain electrodes are provided on the top surface of the glass substrate. Namely, the source/drain electrodes 6 have a double-layered structure which comprises the laminations of undoped indium tin oxide films 4 and the phosphorus-doped indium tin oxide films 5 over the undoped indium tin oxide films 4. An undoped amorphous silicon film 7 is provided which extends over the phosphorus-doped indium tin oxide films 5 and the top surface of the inter-layer insulator 3 between the source/drain electrodes 6. The undoped amorphous silicon film 7 serves as an active layer. The phosphorus-doped indium tin oxide films 5 have such a high impurity concentration as to form ohmic contacts with the undoped amorphous silicon film 7. Namely, the source/drain electrodes 6 have ohmic contacts with the undoped amorphous silicon film 7. A silicon nitride gate insulation film 8 is provided, which extends over a top surface of the undoped amorphous silicon film 7 acting as the active layer. A chromium gate electrode 9 is provided which extends over the top surface of the silicon nitride gate insulation film 8.

As described above, the source/drain electrodes 6 have the double-layered structure which comprises the laminations of undoped indium tin oxide films 4 and the phosphorus-doped indium tin oxide films 5 over the undoped indium tin oxide films 4. The phosphorus-doped indium tin oxide films 5 is highly resistive whilst the undoped indium tin oxide films 4 has a low resistivity. The low resistive undoped indium tin oxide films 4 are much thicker than the highly resistive phosphorus-doped indium tin oxide films 5. In this embodiment, for example, the low resistive undoped indium tin oxide films 4 have a thickens of approximately 450 angstroms, whilst the highly resistive phosphorus-doped indium tin oxide films 5 have a thickens of approximately 50 angstroms. For those reasons, the source/drain electrodes 6 of the indium tin oxide double-layered structure has a relatively low resistivity.

Figure 2A:
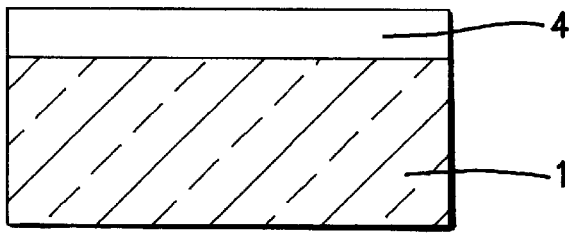
FIGS. 2A through 2C are fragmentary cross sectional elevation views illustrative of the second conventional forward staggered thin film transistors in the processes involved in the second conventional method of fabricating the same.
Figure 2B:
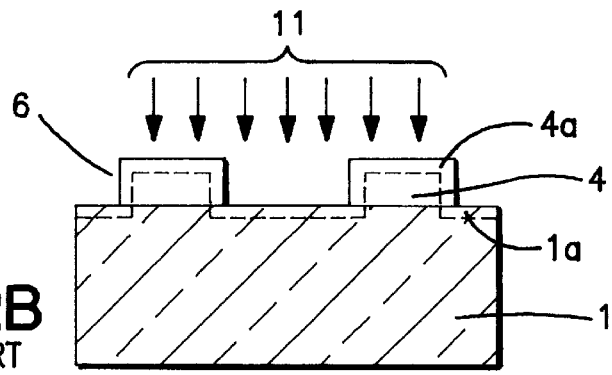
Figure 2C:
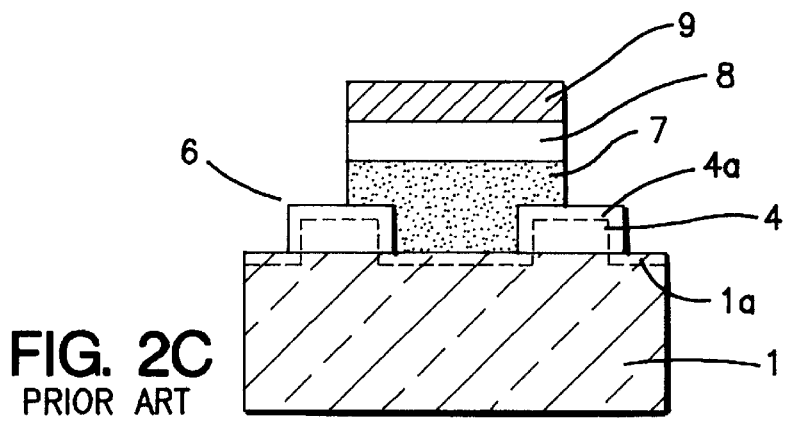

Further, the above novel forward staggered thin film transistor has no impurity doped amorphous silicon region in the undoped amorphous silicon film 7 between the source/drain electrodes 6, differently from the above second conventional thin film transistor illustrated in FIG. 2C. For this reason, the above novel forward staggered thin film transistor illustrated in FIG. 3 is free from the problem with a current leakage through any impurity doped amorphous silicon region in the undoped amorphous silicon film 7 between the source/drain electrodes 6.

The subsequent description will focus on the fabrication processes of the above described novel forward staggered thin film transistor with reference to FIGS. 4A through 4E.

Figure 4A:
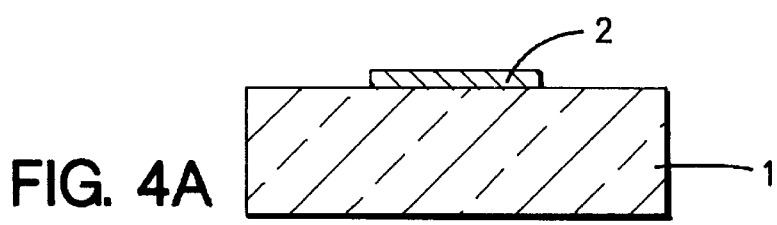
FIGS. 4A through 4E are fragmentary cross sectional elevation views illustrative of novel forward staggered thin film transistors in the processes involved in a novel method of fabricating the same in a preferred embodiment according to the present invention.

With reference to FIG. 4A, a chromium film is deposited on a top surface of a glass substrate 1 by sputtering a chromium target. The chromium film has a thickness of about 1000 angstroms. The chromium film is then patterned by a photo-lithography and a dry etching process to define a chromium optical shielding film 2 which extends on a predetermined region of the top surface of the substrate 1.

Figure 4B:
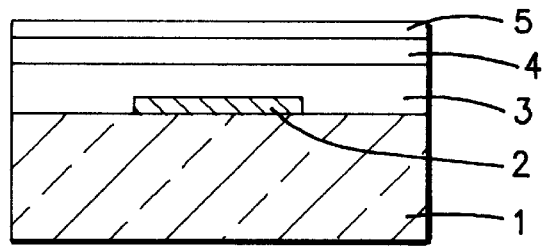

With reference to FIG. 4B, a silicon oxide film is deposited by a sputtering method over the top surface of the glass substrate 1 and the top surface of the chromium optical shielding film 2 thereby to form an inter-layer insulator 3 having a thickness in the range of 2000 angstroms to 4000 angstroms. An undoped indium tin oxide film 4 and a phosphorus-doped indium tin oxide film 5 are successively formed over the top surface of the inter-layer insulator 3 so that the undoped indium tin oxide film 4 extends over the top surface of the inter-layer insulator 3 and the phosphorus-doped indium tin oxide film 5 extends over the top surface of the undoped indium tin oxide film 4. The undoped indium tin oxide film 4 and the phosphorus-doped indium tin oxide film 5 may be deposited by an in-line sputtering apparatus by use of both an undoped indium tin oxide target and a phosphorus-doped indium tin oxide target. Alternatively, the undoped indium tin oxide film 4 and the phosphorus-doped indium tin oxide film 5 may be deposited by a single wafer sputtering apparatus wherein the undoped indium tin oxide target and the phosphorus-doped indium tin oxide target are attached in different chambers so that those films 4 and 5 are successively deposited in a single deposition process.

The impurity doped indium tin oxide target is somewhat expensive as compared to the undoped indium tin oxide target because of its high manufacturing cost and a high low material cost.

Also in view of the resistivity of the laminated indium tin oxide films 4 and 5, the thickness of the phosphorus-doped indium tin oxide film 5 may be about 10% or less of the total thickness of the laminated indium tin oxide films 4 and 5. In this embodiment, the thickness of the phosphorus doped indium tin oxide film 5 is about 50 angstroms and the thickness of the undoped indium tin oxide film 4 is 450 angstroms.

Figure 4C:
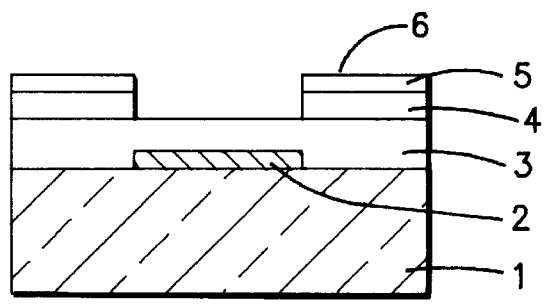

With reference to FIG. 4C, the laminations of the undoped indium tin oxide film 4 and the phosphorus-doped indium tin oxide film 5 are patterned by a photo-lithography and a dry etching to form source/drain electrodes 6 as well as source buses and pixel electrodes both of which are not illustrated. The source/drain electrodes 6 comprise laminations of the undoped indium tin oxide film 4 and the phosphorus-doped indium tin oxide film 5.

Figure 4D:
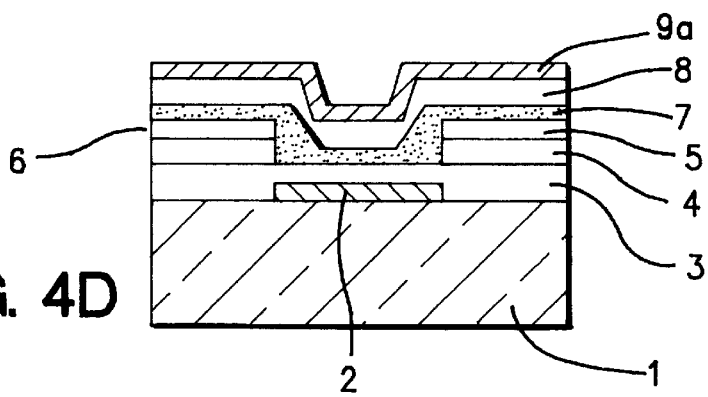

With reference to FIG. 4D, an undoped amorphous silicon film 7 and a silicon nitride gate insulation film 8 are successively deposited by plasma chemical vapor depositions over the source/drain electrodes 6 and the top surface of the inter-layer insulator 3 between the source/drain electrodes 6 so that the undoped amorphous silicon film 7 extends over the source/drain electrodes 6 and the top surface of the inter-layer insulator 3 between the source/drain electrodes 6 and the silicon nitride gate insulation film 8 extends over the undoped amorphous silicon film 7. The plasma chemical vapor deposition is carried out at a substrate temperature in the range of 200° C. to 350° C. whereby phosphorus in the phosphorus-doped indium tin oxide film 5 is diffused into the undoped amorphous silicon film 7 to form a phosphorus-doped amorphous silicon region in the undoped amorphous silicon film 7. As a result, an ohmic contact is formed between the phosphorus-doped indium tin oxide film 5 and the amorphous silicon film 7. A chromium film 9a is deposited over the top surface of the silicon nitride gate insulation film 8 by sputtering a chromium target. The chromium film 9a has a thickness in the range of 1000 angstroms and 2000 angstroms.

Figure 4E:
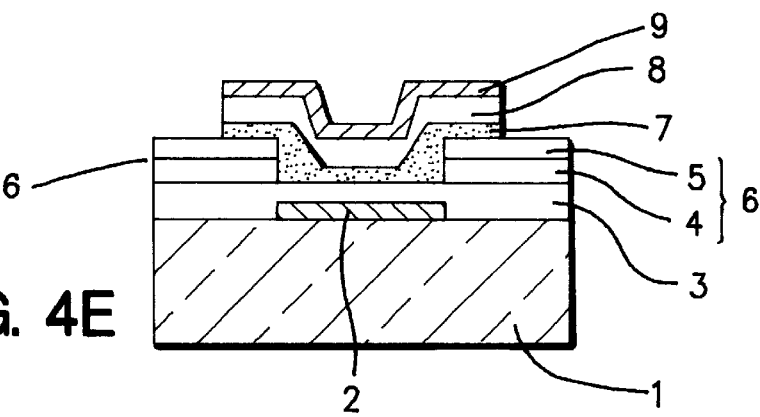

With reference to FIG. 4E, laminations of the undoped amorphous silicon film 7, the silicon nitride gate insulation film 8 and the chromium film 9a are patterned by a photo-lithography and a dry etching process to define an undoped amorphous silicon active layer 7, the silicon nitride gate insulation film 8 and the chromium gate electrode 9. As a result, the forward staggered thin film transistor is completed.

As described above, the plasma chemical vapor deposition for depositions of the undoped amorphous silicon active layer 7 and the silicon nitride gate insulation film 8 is carried out at the substrate temperature in the range of 200° C. to 350° C. whereby phosphorus in the phosphorus-doped indium tin oxide film 5 is diffused into the undoped amorphous silicon film 7 to form the phosphorus-doped amorphous silicon region in the undoped amorphous silicon film 7. As a result, the ohmic contact is formed between the phosphorus-doped indium tin oxide film 5 and the amorphous silicon film 7. Since the undoped amorphous silicon active layer 7 between the source/drain electrodes 6 is in contact with the inter-layer insulator 3, no phosphorus is diffused into the undoped amorphous silicon active layer 7 between the source/drain electrodes 6. For this reason, no phosphorus-doped amorphous silicon region is formed in the undoped amorphous silicon active layer 7 between the source/drain electrodes 6. Namely, since no phosphorus impurity is present between the source/drain electrodes 6, almost no current leakage is caused between the source/drain electrodes 6. The above novel forward staggered thin film transistor is free from the problem with the current leakage between the source/drain electrodes 6. For example, the above novel forward staggered thin film transistor has a substantially reduced current leakage of approximately $1 \times 10^{-12}$. By contrast, the second conventional forward staggered thin film transistor has the phosphorus introduced amorphous silicon region in the undoped amorphous silicon active layer 7 between the source/drain electrodes 6. For this reason, the second conventional forward staggered thin film transistor has a large current leakage of approximately $1 \times 10^{-10}$, which is larger by one hundred times by that of the above novel forward staggered thin film transistor. In this embodiment, there is no particular process for forming the ohmic contacts, resulting in a reduction in the number of the fabrication processes for the novel forward staggered thin film transistor.

As described above, the source/drain electrodes 6 have the double-layered structure which comprises the laminations of undoped indium tin oxide films 4 and the phosphorus-doped indium tin oxide films 5 over the undoped indium tin oxide films 4. The phosphorus-doped indium tin oxide films 5 is highly resistive whilst the undoped indium tin oxide films 4 has a low resistivity. The low resistive undoped indium tin oxide films 4 are much thicker than the highly resistive phosphorus-doped indium tin oxide films 5. In this embodiment, for example, the low resistive undoped indium tin oxide films 4 have a thickens of approximately 450 angstroms, whilst the highly resistive phosphorus-doped indium tin oxide films 5 have a thickens of approximately 50 angstroms. For those reasons, the source/drain electrodes 6 of the indium tin oxide double-layered structure has a relatively low resistivity. For example, the source/drain electrodes 6 of the indium tin oxide double-layered structure has a low sheet resistance in the range of 100–500 Ω/□. By contrast, the source/drain electrodes 6 of the third conventional forward staggered thin film transistor has a high sheet resistance of 1000 Ω/□, provided that the thickness is 500 angstroms.

Since the undoped indium tin oxide films 4 are much thicker than the highly resistive phosphorus-doped indium tin oxide films 5, a consumption of the expensive phosphorus doped indium tin oxide target can be reduced, resulting in a reduction in the manufacturing cost for the novel forward staggered thin film transistor.

As modifications to the above preferred embodiments, it is possible to replace phosphorus as the impurity by arsenic or boron and also replace the indium tin oxide film as the transparent conductive film by a tin oxide film or an indium oxide film.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A method of forming a multi-layer structure between source/drain electrodes and an amorphous silicon layer in a forward staggered thin film transistor, said method comprising the steps of:

forming an undoped indium tin oxide transparent conductive film on an insulator;

forming an impurity doped indium tin oxide transparent conductive film on said undoped transparent conductive film;

patterning laminations of said undoped transparent conductive film and said impurity doped transparent conductive film to form source/drain electrodes; and forming an amorphous silicon active layer over said source/drain electrodes and a top surface of said insulator along with a heat treatment so that in said amorphous silicon active layer over said source/drain electrodes, an impurity diffused interface is formed, which is in contact with said impurity doped transparent conductive film thereby to form ohmic contacts between said impurity doped transparent conductive film and said amorphous silicon active layer, whilst no impurity introduced region is formed in said amorphous silicon active layer being in contact with said top surface of said insulator and being positioned between said source/drain electrodes.

2. The method as claimed in claim 1, wherein said heat treatment is carried out at a temperature in the range of 200° C. to 350° C.

3. The method as claimed in claim 2, wherein said amorphous silicon active layer is deposited by a plasma chemical vapor deposition method.

4. The method as claimed in claim 1, wherein said undoped transparent conductive film and said impurity doped transparent conductive film are successively deposited in an in-line sputtering apparatus provided with both an impurity doped transparent conductive material target and an undoped transparent conductive material target.

5. The method as claimed in claim 4, wherein said impurity doped transparent conductive material target comprises an impurity doped indium tin oxide target and said undoped transparent conductive material target comprises an undoped indium tin oxide target.

6. The method as claimed in claim 4, wherein said impurity doped transparent conductive material target comprises an impurity doped indium oxide target and said undoped transparent conductive material target comprises an undoped indium oxide target.

7. The method as claimed in claim 4, wherein said impurity doped transparent conductive material target comprises an impurity doped tin oxide target and said undoped transparent conductive material target comprises an undoped tin oxide target.

8. The method as claimed in claim 1, wherein said undoped transparent conductive film and said impurity doped transparent conductive film are successively deposited in a single deposition process by use of a single wafer sputtering apparatus having two different chambers being respectively provided with an impurity doped transparent conductive material target and an undoped transparent conductive material target.

9. The method as claimed in claim 8, wherein said impurity doped transparent conductive material target comprises an impurity doped indium tin oxide target and said undoped transparent conductive material target comprises an undoped indium tin oxide target.

10. The method as claimed in claim 8, wherein said impurity doped transparent conductive material target comprises an impurity doped indium oxide target and said undoped transparent conductive material target comprises an undoped indium oxide target.

11. The method as claimed in claim 8, wherein said impurity doped transparent conductive material target comprises an impurity doped tin oxide target and said undoped transparent conductive material target comprises an undoped tin oxide target.

12. The method as claimed in claim 1, wherein said impurity doped transparent conductive film is deposited by sputtering an impurity doped transparent conductive material target so that said impurity doped transparent conductive film has a thickness of approximately 10% or less of a total thickness of said undoped transparent conductive film and said impurity doped transparent conductive film.

13. A method of forming a forward staggered thin film transistor, said method comprising the steps of:

forming an undoped indium tin oxide transparent conductive film on an insulator;

forming an n type impurity doped indium tin oxide transparent conductive film on said undoped transparent conductive film;

patterning laminations of said undoped transparent conductive film and said impurity doped transparent conductive film to form source/drain electrodes; and successively forming an amorphous silicon active layer and a gate insulation film over said source/drain electrodes and a top surface of said insulator along with a heat treatment so that in said amorphous silicon active layer over said source/drain electrodes, an impurity diffused interface is formed which is in contact with said impurity doped transparent conductive film thereby to form ohmic contacts between said impurity doped transparent conductive film and said amorphous silicon active layer, whilst no impurity introduced region is formed in said amorphous silicon active layer being in contact with said top surface of said insulator and being positioned between said source/drain electrodes;

forming a gate electrode film on said gate insulation film; and patterning laminations of said amorphous silicon active layer, said gate insulation film and said gate electrode film.

14. The method as claimed in claim 13, wherein said heat treatment is carried out at a temperature in the range of 200° C. to 350° C.

15. The method as claimed in claim 14, wherein said amorphous silicon active layer is deposited by a plasma chemical vapor deposition method.

16. The method as claimed in claim 13, wherein said undoped transparent conductive film and said impurity doped transparent conductive film are successively deposited in an in-line sputtering apparatus provided with both an impurity doped transparent conductive material target and an undoped transparent conductive material target.

17. The method as claimed in claim 16, wherein said impurity doped transparent conductive material target comprises an impurity doped indium tin oxide target and said undoped transparent conductive material target comprises an undoped indium tin oxide target.

18. The method as claimed in claim 16, wherein said impurity doped transparent conductive material target comprises an impurity doped indium oxide target and said undoped transparent conductive material, target comprises an undoped indium oxide target.

19. The method as claimed in claim 16, wherein said impurity doped transparent conductive material target comprises an impurity doped tin oxide target and said undoped transparent conductive material target comprises an undoped tin oxide target.

20. The method as claimed in claim 13, wherein said undoped transparent conductive film and said impurity doped transparent conductive film are successively deposited in a single deposition process by use of a single wafer sputtering apparatus having two different chambers being respectively provided with an impurity doped transparent conductive material target and an undoped transparent conductive material target.

21. The method as claimed in claim 20, wherein said impurity doped transparent conductive material target comprises an impurity doped indium tin oxide target and said undoped transparent conductive material target comprises an undoped indium tin oxide target.

22. The method as claimed in claim 20, wherein said impurity doped transparent conductive material target comprises an impurity doped indium oxide target and said undoped transparent conductive material target comprises an undoped indium oxide target.

23. The method as claimed in claim 20, wherein said impurity doped transparent conductive material target comprises an impurity doped tin oxide target and said undoped transparent conductive material target comprises an undoped tin oxide target.

24. The method as claimed in claim 13, wherein said impurity doped transparent conductive film is deposited by sputtering an impurity doped transparent conductive material target so that said impurity doped transparent conductive film has a thickness of approximately 10% or less of a total thickness of said undoped transparent conductive film and said impurity doped transparent conductive film.

25. A method of forming a forward staggered thin film transistor, said method comprising the steps of:

selectively forming an optical shielding metal film on a first region of a top surface of a glass substrate;

forming an inter-layer insulator which extends over said optical shielding metal film and said top surface of said glass substrate;

forming an undoped indium tin oxide film on said inter-layer insulator;

forming an impurity doped indium tin oxide film on said undoped indium tin oxide film;

patterning laminations of said undoped indium tin oxide film and said impurity doped indium tin oxide film to form source/drain electrodes; and successively forming an amorphous silicon active layer and a gate insulation film over said source/drain electrodes and a top surface of said insulator along with a plasma chemical vapor deposition method so that in said amorphous silicon active layer over said source/drain electrodes, an impurity diffused interface is formed which is in contact with said impurity doped indium tin oxide film thereby to form ohmic contacts between said impurity doped indium tin oxide film and said amorphous silicon active layer, whilst no impurity introduced region is formed in said amorphous silicon active layer being in contact with said top surface of said insulator and being positioned between said source/drain electrodes;

forming a gate electrode film on said gate insulation film; and patterning laminations of said amorphous silicon active layer, said gate insulation film and said gate electrode film.

26. The method as claimed in claim 25, wherein said heat treatment is carried out at a temperature in the range of 200° C. to 350° C.

27. The method as claimed in claim 25, wherein said amorphous silicon active layer is deposited by a plasma chemical vapor deposition method.

28. The method as claimed in claim 25, wherein said undoped indium tin oxide film and said impurity doped indium tin oxide film are successively deposited in an in-line sputtering apparatus provided with both an impurity doped indium tin oxide target and an undoped indium tin oxide target.

29. The method as claimed in claim 25, wherein said undoped transparent conductive film and said impurity doped indium tin oxide film are successively deposited in a single deposition process by use of a single wafer sputtering apparatus having two different chambers being respectively provided with an impurity doped indium tin oxide target and an undoped indium tin oxide target.

30. The method as claimed in claim 25, wherein said impurity doped indium tin oxide film is deposited by sputtering an impurity doped indium tin oxide target so that said impurity doped indium tin oxide film has a thickness of approximately 10% or less of a total thickness of said undoped indium tin oxide film and said impurity doped indium tin oxide film.

* * * * *